(12) United States Patent
Cai

(10) Patent No.: US 11,367,851 B2
(45) Date of Patent: Jun. 21, 2022

(54) DISPLAY PANEL AND DISPLAY DEVICE

(71) Applicant: WuHan TianMa Micro-electronics CO., LTD., Wuhan (CN)

(72) Inventor: Yu Cai, Wuhan (CN)

(73) Assignee: WUHAN TIANMA MICRO-ELECTRONICS CO., LTD, Wuhan (CN)

( * ) Notice: Subject to any disclaimer, the term of this patent is extended or adjusted under 35 U.S.C. 154(b) by 33 days.

(21) Appl. No.: 16/860,531

(22) Filed: Apr. 28, 2020

(65) Prior Publication Data
US 2021/0202885 A1 Jul. 1, 2021

(30) Foreign Application Priority Data

Dec. 31, 2019 (CN) .......................... 201911411232.5

(51) Int. Cl.
*H01L 27/32* (2006.01)
*H01L 51/52* (2006.01)

(52) U.S. Cl.
CPC ...... *H01L 51/5218* (2013.01); *H01L 27/3218* (2013.01); *H01L 27/3234* (2013.01); *H01L 27/3276* (2013.01)

(58) Field of Classification Search
CPC ............. H01L 51/5218; H01L 27/3227; H01L 27/3216; H01L 27/3218; H01L 27/326; H01L 27/3234; G09G 2300/0426; G09G 2300/0439; G06F 1/605
See application file for complete search history.

(56) References Cited

U.S. PATENT DOCUMENTS

| | | | |
|---|---|---|---|
| 2007/0046592 A1* | 3/2007 | Ono | G09G 3/3233 345/77 |
| 2020/0052052 A1* | 2/2020 | Nishimura | H01L 51/0004 |
| 2020/0381651 A1* | 12/2020 | Wang | H01L 27/3227 |
| 2021/0074731 A1* | 3/2021 | Cheng | H01L 51/0097 |
| 2021/0110761 A1* | 4/2021 | Liu | G09G 3/32 |
| 2021/0193758 A1* | 6/2021 | Choi | H01L 27/3276 |
| 2021/0359028 A1* | 11/2021 | Asaoka | H01L 27/3216 |

FOREIGN PATENT DOCUMENTS

| | | |
|---|---|---|
| CN | 109801950 A | 5/2019 |
| CN | 110190099 A | 8/2019 |
| CN | 110504289 A | 11/2019 |
| WO | 2019242510 A1 | 12/2019 |

OTHER PUBLICATIONS

State Intellectual Property Office of the People's Republic of China, Chinese Application No. 201911411232.5, dated Apr. 18, 2022, 21 pages.

* cited by examiner

*Primary Examiner* — Eric K Ashbahian
(74) *Attorney, Agent, or Firm* — Christensen O'Connor Johnson Kindness PLLC

(57) ABSTRACT

A display panel and a display device including the display panel are provided. The display panel includes first pixel units arranged in a first display area and second pixel units arranged in a second display area, a density of the first pixel units in the first display area is smaller than a density of the second pixel units in the second display area, each of the first pixel units includes a first anode comprising a first reflective metal layer and a first transparent conductive layer, the first reflective metal layer and the first transparent conductive layer are stacked on each other, and an area of the first reflective metal layer is smaller than an area of the first transparent conductive layer.

16 Claims, 8 Drawing Sheets

US 11,367,851 B2

DISPLAY PANEL AND DISPLAY DEVICE

CROSS-REFERENCE TO RELATED DISCLOSURES

The present disclosure claims priority to Chinese Patent application No. 201911411232.5, filed on Dec. 31, 2019, the content of which is incorporated herein by reference in its entirety.

TECHNICAL FIELD

The present disclosure relates to the field of display technologies, and in particular, to a display panel and a display device.

BACKGROUND

The display technology has entered all aspects of people's daily life, and accordingly, more and more materials and technologies are applied to display screens. The mainstream display screens mainly include liquid crystal displays and organic light-emitting diode (OLED) displays. Compared to the liquid crystal display, the organic light-emitting diode display is self-luminous and removes the most energy-consuming backlight module, so it is more energy-saving. In addition, the organic light-emitting diode display is also flexible and bendable. By using a flexible substrate, a plurality of conductive layers, including a thin film transistor driving array layer, an anode layer, an organic light-emitting layer, a cathode layer, and a thin film encapsulation layer, is formed on the flexible substrate in sequence, such that the OLED display has excellent bendability.

Based on the development of flexible substrate technology, the design concept of "full screen" (the display area nearly occupying the entire display panel, and the non-display area occupying little area or zero area of the entire display panel) is proposed and is applied to various display terminals, such as the cell phone. Based on the design concept of "full screen", a concern is how to integrate the function of taking pictures or videos, while preventing the camera area from occupying the display area. One design solution is to set the camera in the display area to take into account both the camera and display functions.

SUMMARY

In a first aspect, an embodiment of the present disclosure provides a display panel. The display panel has a first display area and a second display area. The display panel includes first pixel units arranged in the first display area and second pixel units arranged in the second display area. A density of the first pixel units in the first display area is smaller than a density of the second pixel units in the second display area. Each of the first pixel units includes a first anode, the first anode includes a first reflective metal layer and a first transparent conductive layer, and the first reflective metal layer and the first transparent conductive layer are stacked on each other. An area of the first reflective metal layer is smaller than an area of the first transparent conductive layer.

In another aspect, the present disclosure provides a display device including the display panel provided in the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely intended to describe exemplary embodiments, and not to limit the present disclosure. Unless otherwise noted in the context, the expressions "a", "an", "the" and "said" in singular form in the embodiments and appended claims of the present disclosure are also intended to represent a plural form.

It should be understood that the term "and/or" used herein is merely an association relationship describing associated objects, which means that there can be three relationships, for example, A and/or B can mean: A alone, A and B, and B alone. In addition, the character "/" in the present disclosure generally indicates that the related objects are in an "or" relationship.

It should be understood that although the terms "first", "second" "third", etc. may be used to describe pixel groups in embodiments of the present disclosure, these pixel groups should not be limited to these terms. These terms are only used to distinguish pixel groups from each other. For example, without departing from the scope of the embodiments of the present disclosure, a first display area can also be referred to as a second display area, and similarly, a second display area can also be referred to as a first display area.

In a related art, camera modules are integrated in a display area of the display panel in order to realize the "full screen" design concept. Generally, a transmittance of external light in the display area is increased by reducing the number of pixel units per unit area of a light-receiving area for the camera, i.e., reducing a pixel density, so that external light passes through the display area and then the camera module can sense the light to perform functions such as taking pictures or video. Therefore, it has become a mainstream design to reduce the pixel density in the display area (or referred to as "virtual hole" area) where the camera is located.

In such design, in order to achieve a brightness uniformity of an entire display screen, a light-emitting area of a pixel unit arranged in a normal display area is generally set to be equal to a light-emitting area of a pixel unit arranged in the "virtual hole" area. Because the number of pixel units arranged in the "virtual hole" area is smaller, a current density in this area will inevitably be higher than a current density in the normal display area, resulting in accelerated aging and yellowing of pixels in the "virtual hole" area, deteriorated appearance, and a possibility of obvious afterimage.

Figure 1:
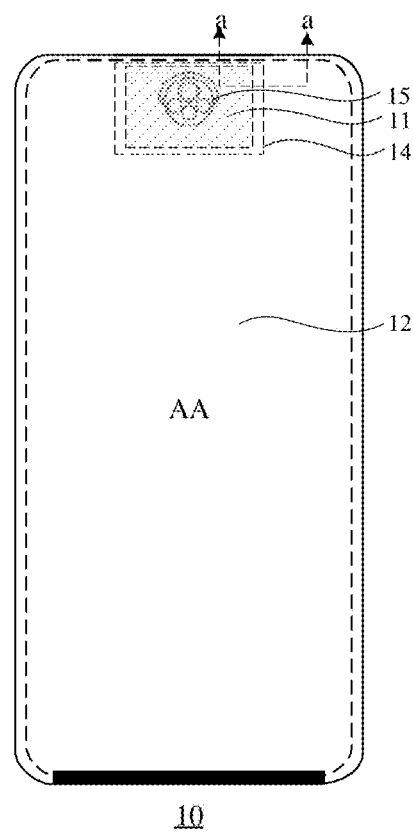
FIG. 1 is a schematic structural diagram of a display panel according to an embodiment of the present disclosure.
Figure 2:
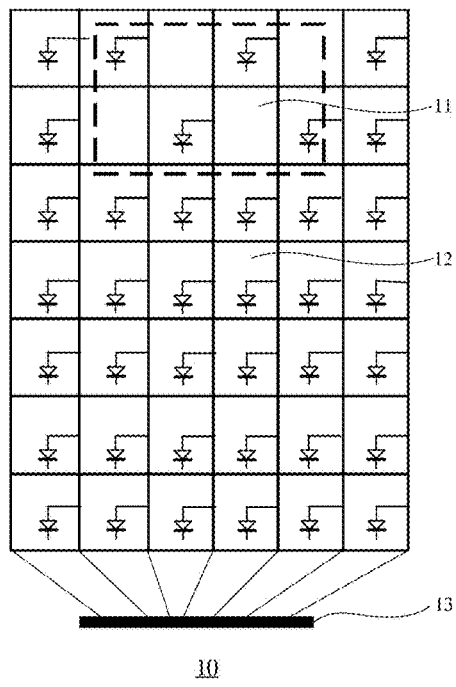
FIG. 2 is another schematic diagram of the display panel in FIG. 1.
Figure 3:
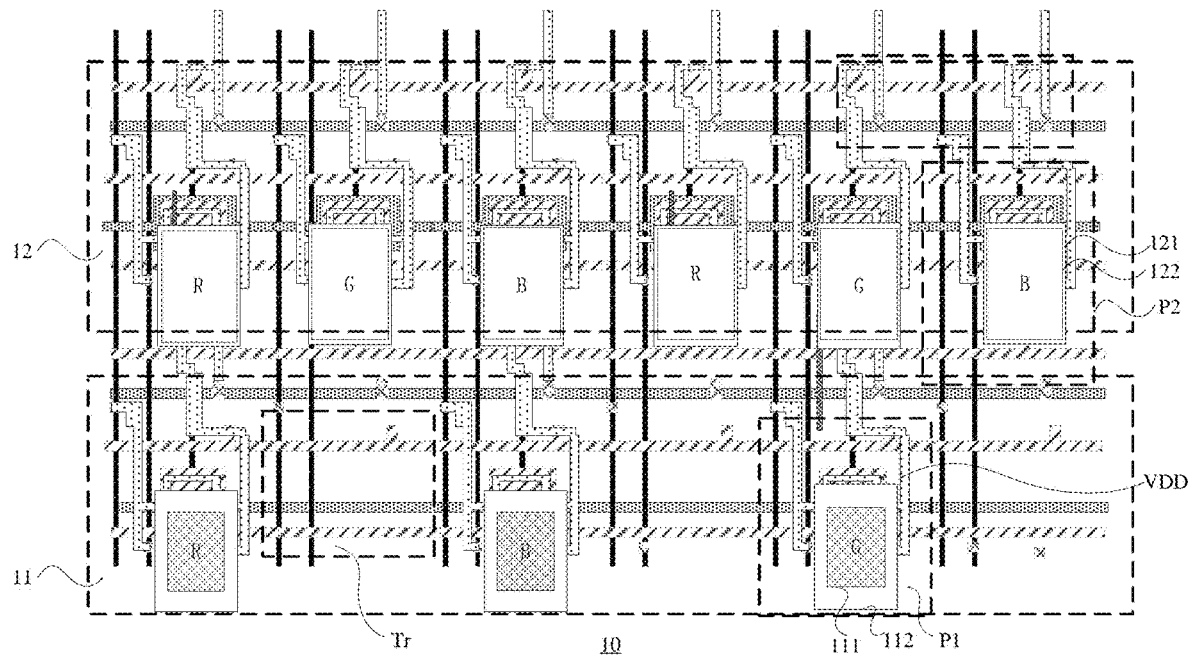
FIG. 3 is a partial schematic diagram of the display panel in FIG. 2.
Figure 4:
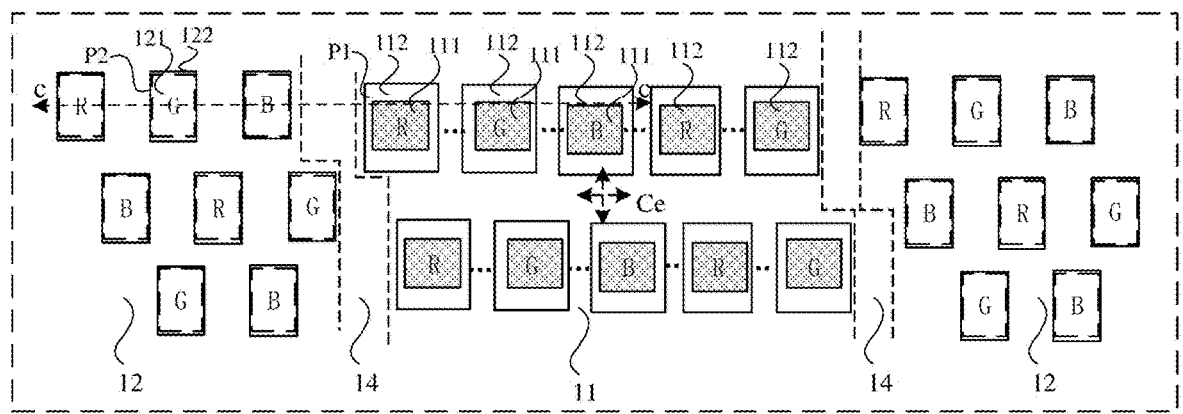
FIG. 4 is a partially enlarged view of a first display area and a second display area taken along a dashed line aa in FIG. 1.

As shown in FIG. 1 to FIG. 18, embodiments of the present disclosure provide a display panel 10 having a first display area and a second display area. M first pixel units are arranged in each unit area of the first display area and N second pixel units are arranged in each unit area of the second display area. M and N are positive integers and N>M. The first pixel unit includes a first anode, and the first anode includes a first reflective metal layer and a first transparent conductive layer that are stacked on each other. An area S11 of the first reflective metal layer is smaller than an area S12 of the first transparent conductive layer. In order to improve a light transmittance of the pixel unit in the first display area, a charge-transferring function of the anode of the pixel unit must be ensured, so as to ensure that a light-emitting layer of the pixel unit emits light normally. The area of the reflective metal layer of the anode of the pixel unit is reduced to improve the light transmittance of the pixel unit in the first display area and to reduce problems such as uneven display or color difference of the first display area and the second display area. As shown in FIG. 1 to FIG. 3, an embodiment of the present disclosure provides a display panel 10 having a display area AA and including a driving chip 13 that provides a control signal to the display area. A camera module 15 is integrated in the display area AA. The display area AA includes a first display area 11 and a second display area 12 surrounding the first display area 11. The first display area 11 further includes a transition area 14 close to the second display area 12.

In an embodiment of the present disclosure, the camera module 15 is integrated in the display area AA of the display panel 10. In an embodiment, the camera module 15 is integrated in the first display area 11. In an embodiment, functional components of the camera module can be integrated into a thin film transistor driving array of the display panel through a semiconductor process, or the camera module can be disposed on a back side of the display panel corresponding to the first display area 11 in an add-on manner.

Figure 18:
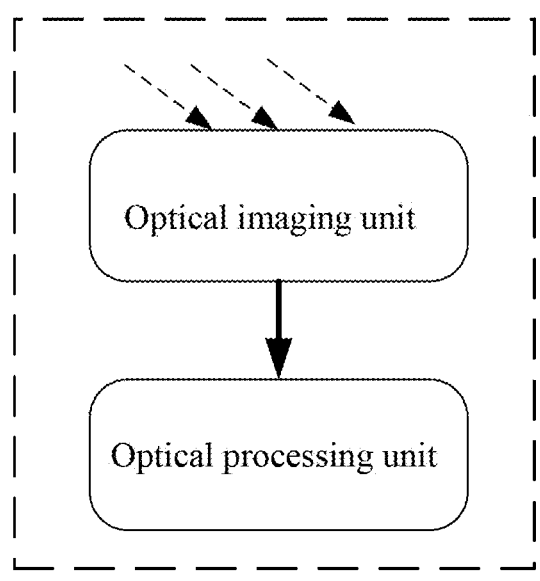
FIG. 18 is a schematic structural diagram of a camera module in FIG. 1.

When the camera module 15 operates, that is, when taking pictures or videos, a plurality of first display units P1 arranged in the first display area 11 are in a non-operating state, that is, a state in which no light is emitted or no image is displayed. When the camera module 15 is turned off, that is, when no picture or video is taken, the plurality of first display units P1 arranged in the first display area 11 are in a non-operating state, that is, a state in which no light is emitted or no image is displayed. For the camera module 15, as shown in FIG. 18, the camera module 15 includes an optical imaging unit and an image processing unit. An operating mechanism of the camera module 15 can be understood as: external light penetrates the first display area 11 of the display panel and enters the optical imaging unit, and the optical imaging unit converts a light signal into a current signal and transmits the current signal to the image processing unit. After the current signal is processed by the image processing unit, corresponding image or video data are formed.

No matter when the camera module 15 is in an operating state or a turn-off state, the second display area 12 displays or does not display independently. Therefore, the second display area can be interpreted as a normal display area. Since the first display area can realize both displaying and camera shooting (including a camera function), it can be interpreted as a "virtual hole area", that is, a part of the display panel corresponding to the first display area is not a structure that is not completely transparent in the true sense.

In order to make the first display area 11 have both a display function and an camera shooting function, the light transmittance of the first display area 11 needs to be improved so as to ensure that external light can enter the optical imaging unit of the camera module 15 through the first display area 11. In an embodiment of the present disclosure, a distribution density m1 of the first pixel units P1 in the first display area 11 is set to be smaller than a distribution density m2 of the second pixel units P2 in the second display area 12. In an embodiment, M first pixel units P1 are arranged in each unit area of the first display area 11, M being a positive integer, and N second pixel units P2 are arranged in each unit area of the second display area 12, N being a positive integer and N>M.

In an embodiment of the present disclosure, for example, four to six second pixel units P2 are arranged in each unit area of the second display area 12, and one first pixel unit P1 is arranged in each unit area of the first display area 11. In other words, the distribution density m2 of pixel units in the second display area 12 is four to six times the distribution density m1 of pixel units in the first display area 11. Referring to FIG. 3, a plurality of light-transmitting areas Tr can be formed in the first display area 11 by reducing the distribution density m1 of the pixel units in the first display area 11, and no light shielding member with a large area such as a reflective anode is provided in the light-transmitting areas. Only metal signal traces are sparsely provided in the light-transmitting areas Tr. That is, a light transmittance p1 of the first display area 11 is greater than a light transmittance p2 of the second display area.

The light transmittance p1 of the first display area 11 is improved by reducing the distribution density of the pixel units in the first display area 11, and meanwhile a display uniformity of the first display area 11 and the second display area 12 is ensured, such that images are evenly and smoothly displayed in the entire display area AA. Since the distribution density of the pixel units in the first display area 11 is smaller, in order to balance an overall display effect, in an embodiment of the present disclosure, a light-emitting area A1 of the first pixel unit P1 is larger than or equal to a light-emitting area A2 of the second pixel unit P2.

Figure 5:
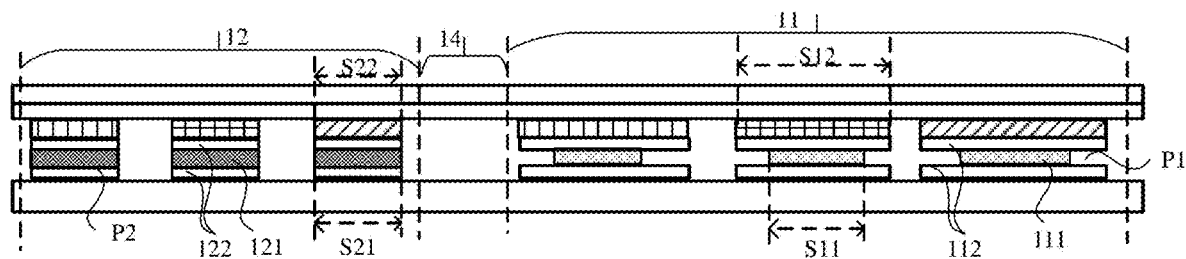
FIG. 5 is a cross-sectional view taken along a dashed line cc in FIG. 4.
Figure 6:
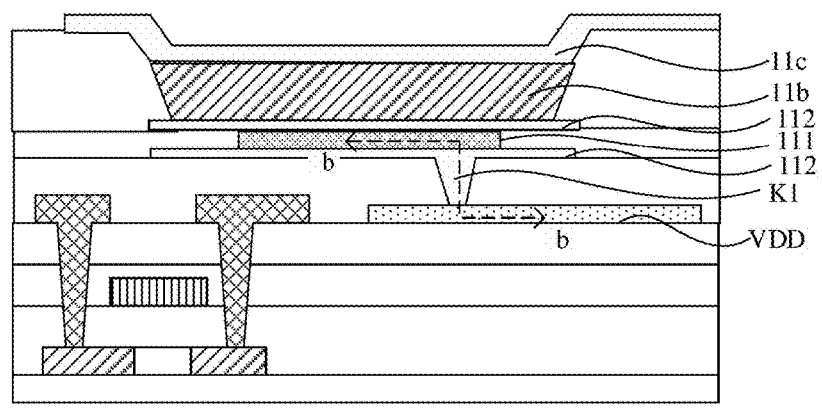
FIG. 6 is a cross-sectional view of a first pixel unit in FIG. 2.
Figure 7:
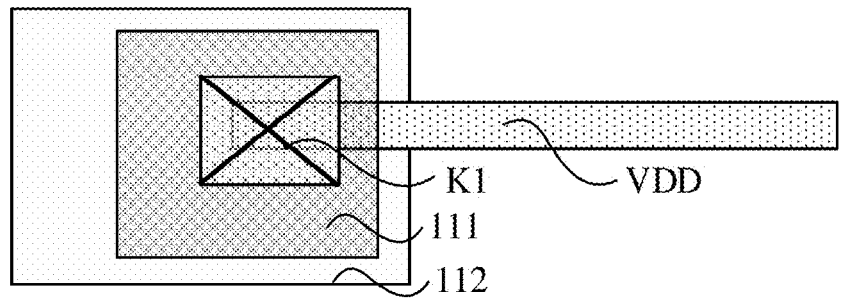
FIG. 7 is a top view taken along a dashed line bb in FIG. 6.

As shown in FIG. 3 to FIG. 6, FIG. 16, and FIG. 17, the first pixel unit P1 arranged in the first display area 11 includes a first anode 11a, a first light-emitting layer 11b, and a first cathode 11c that are arranged in sequence along a thickness direction of the display panel. The first anode 11a has a sandwich structure and includes a first reflective metal layer 111 and first transparent conductive layers 112 that are stacked on each other. As shown in FIG. 6, one first transparent conductive layer 112, one first reflective metal layer 111, and another first transparent conductive layer 112 are sequentially included along the thickness direction of the display panel. In an embodiment of the present disclosure, the first reflective metal layer 111 is made of metal silver (Ag) and has a high light reflectance, and the first transparent conductive layer 112 is made of indium tin oxide (ITO) and has a good light transmittance.

In other embodiments, it is also feasible that the first reflective metal layer 111 includes Mg—Ag metal alloy and the first transparent conductive layer 112 is made of indium tin oxide. In addition, the first anode 11a of the first pixel unit P1 is correspondingly connected to a driving thin film transistor, and the driving thin film transistor provides a driving signal to the first pixel unit 11 to realize a switching control on the first pixel unit P1.

With continued reference to FIG. 3 to FIG. 6, FIG. 16 and FIG. 17, the second pixel unit P2 arranged in the second display area 12 includes a second anode 12a, a second light-emitting layer 12b, and a second cathode 12c that are arranged in sequence along the thickness direction of the display panel. The second anode 12a has a sandwich structure including a second reflective metal layer 121 and two second transparent conductive layers 122 that are stacked on each other. One second transparent conductive layer 122, one second reflective metal layer 121, and another second transparent conductive layer 122 are sequentially included along the thickness direction of the display panel. In an embodiment of the present disclosure, the second reflective metal layer 121 includes metal silver (Ag) and has a high light reflectance, and the second transparent conductive layer 122 includes ITO and has a good light transmittance.

In an embodiment, an area S21 of the second reflective metal layer 121 is equal or substantially equal to an area S22 of the second transparent conductive layer 122. In order to ensure that the light transmittance of the first pixel unit P1 arranged in the first display area 11 is greater than the light transmittance of the second pixel unit P2 arranged in the second display area 12, in an embodiment of the present disclosure, an area S11 of the first reflective metal layer arranged in the first display area 11 is set to be smaller than an area S21 of the second reflective metal layer arranged in the second display area 12. In order to ensure a uniform change in display brightness, an area S11 of the first reflective metal layer arranged in the transition area 14 may be equal to the area S21 of the second reflective metal layer.

In other embodiments, it is also feasible that the second reflective metal layer 121 is made of Mg—Ag metal alloy and the second transparent conductive layer 122 is made of indium tin oxide. In addition, the second anode 12a of the second pixel unit P2 is correspondingly connected to a driving thin film transistor which provides a driving signal to the second pixel unit P2 to realize a switching control on the second pixel unit P2.

As described above, since the distribution density of the pixel units in the first display area 11 is smaller, in order to achieve an overall uniform display effect of the entire display panel, in an embodiment of the present disclosure, the light-emitting area A1 of the first pixel unit P1 is greater than or equal to the light-emitting area A2 of the second pixel unit P2. As shown in FIG. 5, in an embodiment of the present disclosure, the area S12 of the first transparent conductive layer 112 in the first anode 11a is set to be larger than the area S22 of the second transparent conductive layer 122 in the second anode 12a. Herein, the area of the transparent conductive layer refers to an area corresponding to a contour formed by the transparent conductive layer on a plane parallel to the display panel.

In other embodiments of the present disclosure, for example, the area S22 of the second transparent conductive layer 122 of the second anode 12a can be equal to the area S12 of the first transparent conductive layer 112 at a central area Ce of the first display area. Therefore, by increasing the area of the transparent conductive layer of at least one first pixel unit P1 in the first display area 11, the light-emitting area A1 of the first pixel unit P1 is increased, so that a luminous brightness of the first display area 11 matches a luminous brightness of the second display area 12.

On the basis of the above embodiments, since the distribution density of the first pixel units P1 in the first display area 11 is small, in order to retain consistency with the current density of the second pixel units P2 in the second display area 12, in an embodiment of the present disclosure, the area of the reflective metal layer of the anode of the pixel unit arranged in the first display area 11 is reduced. That is, the current density of the pixel units is reduced by setting the area of the reflective metal layer of the anode to be smaller than the area of the transparent conductive layer of the anode.

As shown in FIG. 3 to FIG. 6, when the display panel 10 is in the operating state, a current density I1 flowing through the first pixel unit P1 is equal to or substantially equal to a current density I2 flowing through the second pixel unit P2, so that the first pixel unit P1 and the second pixel unit P2 have a substantially same service life. In an embodiment of the present disclosure, in terms of the first anode 11a of the first pixel unit P1, the area S11 of the first reflective metal layer 111 is set to be smaller than the area S12 of the first transparent conductive layer 112. It can be understood that, since the first anode 11a has a sandwich structure and the first reflective metal layer 111 is an intermediate layer thereof, the current on the first anode 11a can be reduced when the area S21 of the first reflective metal layer 111 is reduced. Herein, the area S21 of the first reflective metal layer 111 is equivalent to a real effective area of the first anode 114, i.e., equivalent to an effective area of the first anode 11a through which flows a current 1 generated by the driving thin film transistor. Therefore, the degree of aging and attenuation of a light-emitting material of the first light-emitting layer 11b of the first pixel unit P1 can be reduced, and thus the service life of the first pixel unit P1 can be improved.

In terms of the reduction of the area S11 of the first reflective metal layer 111, both the display effect of the first pixel unit P1 and the function of the first anode 11a need to be taken into account, such as a stability of an electrical connection between the first anode 11a and a constant potential signal line. As shown in FIG. 3 and FIG. 6, the display panel 10 further includes a constant potential signal line VDD configured to supply a constant potential signal to the first pixel unit P1. In an embodiment of the present disclosure, the constant potential signal line VDD can be configured to provide a positive voltage, such as a voltage of +5V, to the first anode 11a. A connection between the constant potential signal line VDD and the first pixel unit P1 can be referred to FIG. 6 and FIG. 7. In the first pixel unit P1, the constant potential signal line VDD is electrically connected to the first anode through a first via K1.

To ensure a stability of the electrical connection of the first anode with the constant potential signal line VDD, in an embodiment of the present disclosure, the area S11 of the first reflective metal layer 111 is larger than an area $S_{via}$ of the first via K1. In an embodiment of the present disclosure, the area $S_{via}$ of the first via K1 can be as small as about 2 μm². In an embodiment of the present disclosure, in order to ensure the conductivity of the first anode, the resistivity of the first anode is reduced by providing the first reflective metal layer 111. Since the first transparent conductive layer made of transparent ITO material has a relatively large resistivity, the first reflective metal layer 111 with a certain area is provided in order to balance an overall conductivity.

On the basis of the above embodiments, with continued reference to FIG. 1, FIG. 2, and FIG. 8 to FIG. 11, the following embodiments are also provided in the present disclosure, the difference between the area S12 of the first transparent conductive layer and the area S11 of the first reflective metal layer of the first pixel unit P1 gradually increases along a direction from the transition area 14 to the central area Ce of the first display region 11. In this way, the chromaticity difference of the transition area 14 or the unevenness in brightness between the first display area 11 and the second display area 12 is eliminated.

Figure 8:
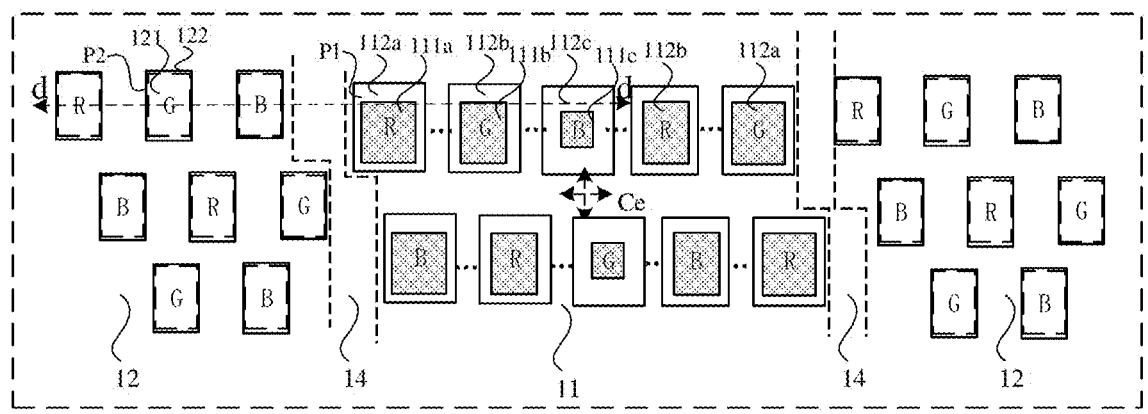
FIG. 8 is another partial enlarged view of the first display area and the second display area taken along the dashed line aa in FIG. 1.
Figure 9:
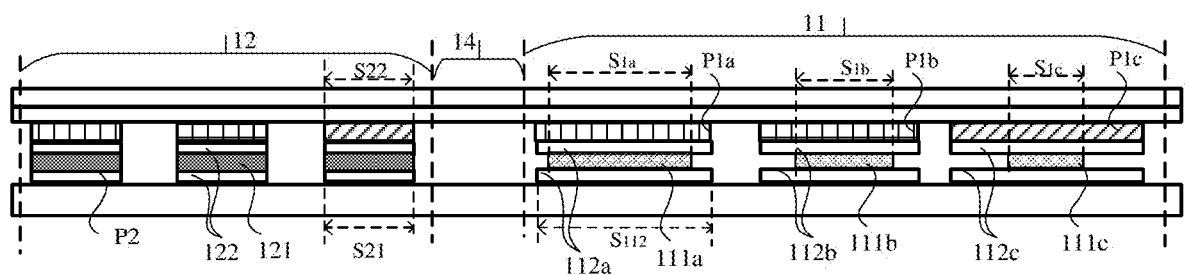
FIG. 9 is a cross-sectional view taken along a dashed line dd in FIG. 8.

In an embodiment of the present disclosure, as shown in FIG. 8 and FIG. 9, in the direction from the transition area 14 to the central area Ce of the first display area 11, a plurality of first pixel units are arranged, areas S12 of a plurality of first transparent conductive layers are equal, and areas of a plurality of first reflective metal layers gradually decrease. As shown in the figures, schematically, a first A1 pixel unit P1a, a first B1 pixel unit P1b, and a first C1 pixel unit P1c are arranged in the direction from the transition area 14 to the central area Ce of the first display area 11.

The first A1 pixel unit P1a includes a first A1 transparent conductive layer 112a and a first A1 reflective metal layer 111a. The first B1 pixel unit P1b includes a first B1 transparent conductive layer 112b and a first B1 reflective metal layer 111b. The first C1 pixel unit P1c includes a first C1 transparent conductive layer 112c and a first C1 reflective metal layer 111c.

An area of the first A1 transparent conductive layer 112a, an area of the first B1 transparent conductive layer 112b, and an area of the first C1 transparent conductive layer 112c are substantially equal. For example, the area S112 of the first A1 transparent conductive layer 112a is equal to or substantially equal to areas of other two transparent conductive layer. For the reflective metal layers, the areas of the three reflective metal layers gradually decrease. An area S1a of the first A1 reflective metal layer 111a is larger than an area S1b of the first B1 reflective metal layer 111b, and the area S1b of the first B1 reflective metal layer 111b is larger than an area S1c of the first C1 reflective metal layer 111c. The area S1c of the first C1 reflective metal layer 111c of the first C1 pixel unit P1c that is located in the central area is the smallest.

Through the above embodiments, the areas of the reflective metal layers of the first pixel units P1 gradually decrease to eliminate the chromaticity difference between pixel units in the second display area 12 and pixel units in the first display area 11, thereby achieving uniform display of the display panel.

Figure 10:
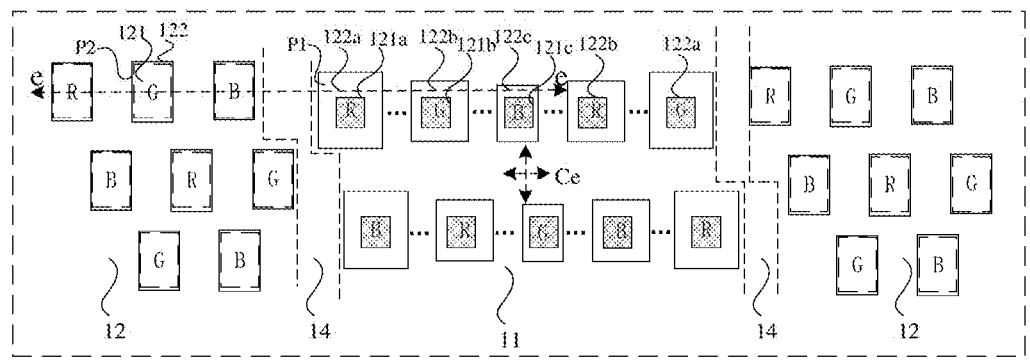
FIG. 10 is another partial enlarged view of the first display area and the second display area taken along the dotted line aa in FIG. 1.
Figure 11:
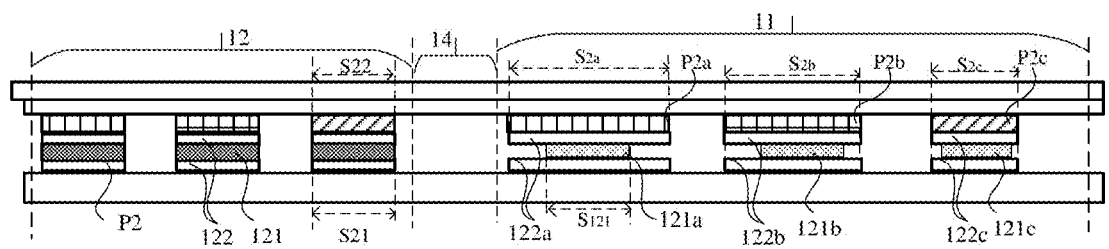
FIG. 11 is a cross-sectional view taken along a dashed line ee in FIG. 10.
Figure 12:
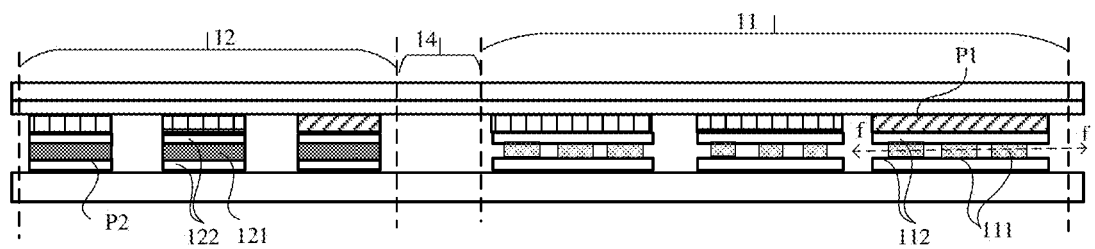
FIG. 12 is another cross-sectional view of the first display area and the second display area taken along the dashed line aa in FIG. 1.

Based on the above embodiments, as shown in FIG. 10 and FIG. 11, in an embodiment of the present disclosure, the difference between the area S12 of the first transparent conductive layer and the area S11 of the first reflective metal layer gradually decreases for the first pixel units arranged from the transition area to the central area of the first display area.

In an embodiment of the present disclosure, areas of first reflective metal layers of a plurality of first pixel units P1 arranged from the transition area 14 to the central area Ce of the first display region 11 are equal, and areas of first transparent conductive layers of the plurality of first pixel units P1 gradually decrease along the direction from the transition area 14 to the central area Ce of the first display region 11. The area S12 of the first transparent conductive layer in the central area Ce is equal to the area S22 of the second transparent conductive layer. As shown in the figure, schematically, a first A2 pixel unit P2a, a first B2 pixel unit P2b, and a first C2 pixel unit P2c are arranged in the direction from the transition area 14 to the central area Ce of the first display area 11.

The first A2 pixel unit P2a includes a first A2 transparent conductive layer 122a and a first A2 reflective metal layer 121a. The first B2 pixel unit P2b includes a first B2 transparent conductive layer 122b and a first B2 reflective metal layer 121b. The first C2 pixel unit P2c includes a first C2 transparent conductive layer 122c and a first C2 reflective metal layer 121c.

As shown in FIG. 11, an area of the first A2 reflective metal layer 121a, an area of the first B2 reflective metal layer 121b, and an area of the first C2 reflective metal layer 121c are substantially equal. For example, the area S2a of the first A2 reflective metal layer 121a is equal or substantially equal to the areas of other two reflective metal layers. For the transparent conductive layers, the areas of the three transparent conductive layers gradually decrease. In an embodiment, the area S2a of the first A2 transparent conductive layer 122a is larger than an area S2b of the first B2 transparent conductive layer 122b, the area S2b of the first B2 transparent conductive layer 122b is larger than an area S2c of the first C2 transparent conductive layer 122c. The area S2c of the first C2 transparent conductive layer 122c of the first C1 pixel unit P1c that is located in the central area is the smallest.

In an embodiment of the present disclosure, the area S2c (which can be interpreted as the area S12 of the first transparent conductive layer) of the first C2 transparent conductive layer 122c of the first C1 pixel unit P1c located in the central area Ce is the same as the area S22 of the second transparent conductive layer located in the second display area 12. That is, a minimum area of the first transparent conductive layer located in the first display area 11 is equal to the area of the second transparent conductive layer located in the second display area 12, thereby ensuring a light-emitting area of the first display area.

Through the above embodiments, areas of the transparent conductive layers of the first pixel units P1 gradually decrease to eliminate the difference in brightness between the pixel unit located in the second display area 12 and the pixel unit located in the first display region 11, thereby realizing uniform display of the display panel.

On the basis of the above embodiments, with continued reference to FIG. 1, FIG. 2, and FIG. 12 to FIG. 14, in the following embodiments of the present disclosure, the first reflective metal layer 111 of the first pixel unit P1 located in the first display area 11 includes a plurality of reflective metal sub-electrodes. The plurality of reflective metal sub-electrodes is separated from each other or electrically connected to each other.

Figure 13:
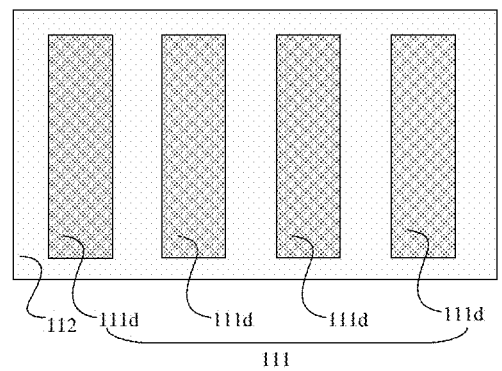
FIG. 13 is a cross-sectional view taken along a dashed line ff in FIG. 12.

In an embodiment of the present disclosure, as shown in FIG. 13, the first reflective metal layer 111 includes a plurality of first reflective metal sub-electrodes 111d, each of which has a stripe-like structure. By providing the plurality of stripe-like first reflective metal sub-electrodes 111d separated from each other or electrically connected to each other, the area of the first reflective metal layer is reduced, thereby reducing a current density of the first pixel unit, and extending the service life of the first pixel unit P1. In addition, with the strip-like reflective metal sub-electrodes, contact between the reflective metal layer and the transparent electrode layer becomes more uniform, so that current transmission becomes more stable.

Figure 14:
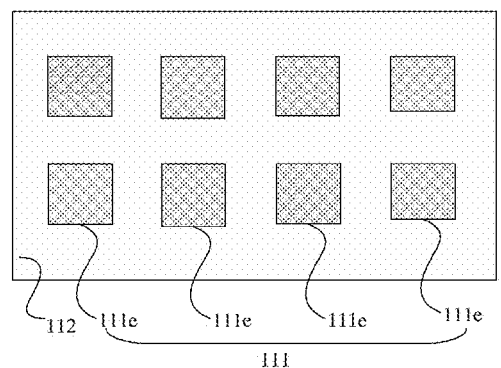
FIG. 14 is another cross-sectional view taken along the dashed line ff in FIG. 12.

In an embodiment of the present disclosure, as shown in FIG. 14, the first reflective metal layer 111 includes a plurality of second reflective metal sub-electrodes 111e, each of which has a block-like structure, and the plurality of second reflective metal sub-electrodes the are distributed as scattered spots. By providing the plurality of second reflective metal sub-electrodes 111e that are separated from each other and distributed as scattered spots, the area of the first reflective metal layer is reduced, thereby reducing the current density of the first pixel unit P1 and extending the service lifetime of the first pixel unit P1. In addition, the reflective metal electrodes distributed as scattered spots can allow more uniform contact between the reflective metal layer and the transparent electrode layer, thereby making the current transmission more stable.

On the basis of the above embodiments, with continued reference to FIG. 1, FIG. 2 and FIG. 15, in the following embodiment, the first pixel units arranged in the first display area 11 include a first red pixel unit PR, a first green pixel unit PG, and a first blue pixel unit PB. Light-emitting materials of the pixel units which emit light of different colors have different properties, for example, a decay rate of a light-emitting material which emits green light is faster than that of other light-emitting materials.

Figure 15:
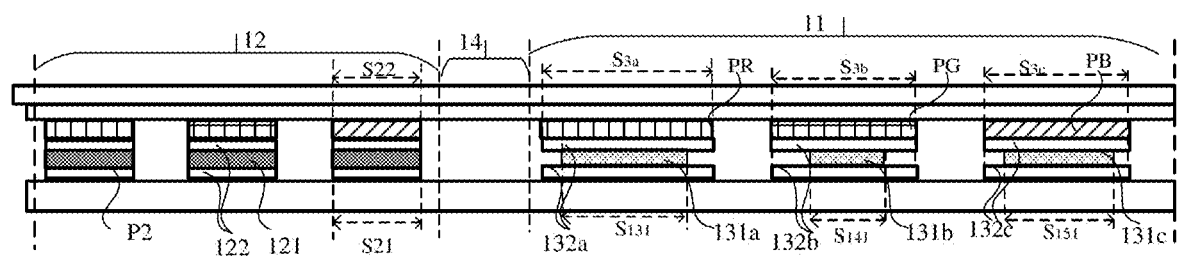
FIG. 15 is another cross-sectional view of the first display area and the second display area taken along the dashed line aa in FIG. 1.
Figure 16:
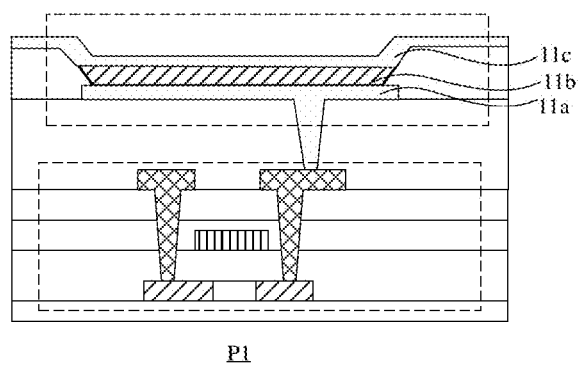
FIG. 16 is another cross-sectional view of the first pixel unit in FIG. 2.
Figure 17:
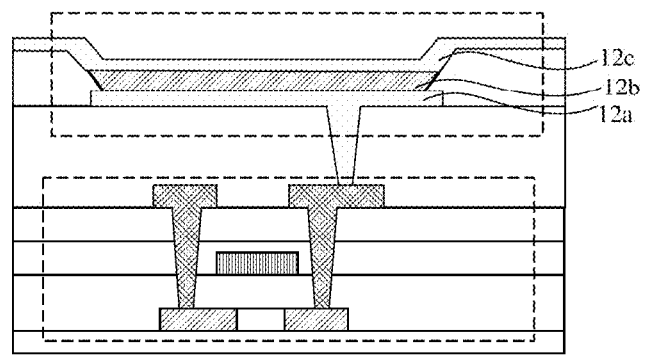
FIG. 17 is a cross-sectional view of the second pixel unit in FIG. 2.

With continued reference to FIG. 15, an anode of the first red pixel unit PR includes a red reflective metal layer 131a and red transparent metal layers 132a, an anode of the first green pixel unit PG includes a green reflective metal layer 131b and green transparent metal layers 132b, and an anode of the first blue pixel unit PB includes a blue reflective metal layer 131c and blue transparent metal layers 132c.

An area $S_{3a}$ of the red transparent metal layer 132a is larger than an area $S_{131}$ of the red reflective metal layer 131a, and a difference therebetween is $\Delta S_{31}$.

An area $S_{3b}$ of the green transparent metal layer 132b is larger than an area $S_{141}$ of the green reflective metal layer 131b, and a difference therebetween is $\Delta S_{41}$.

An area $S_{3c}$ of the blue transparent metal layer 132c is larger than an area $S_{151}$ of the blue reflective metal layer 131c, and a difference therebetween is $\Delta S_{51}$.

In an embodiment of the present disclosure, $\Delta S_{41}$ is greater than at least one of $\Delta S_{31}$ or $\Delta S_{51}$.

In an embodiment of the present disclosure, $\Delta S_{41}$ is greater than both $\Delta S_{31}$ and $\Delta S_{51}$.

In an embodiment of the present disclosure, $\Delta S_{31}$ is greater than or equal to $\Delta S_{51}$, and $\Delta S_{41}$ is greater than $\Delta S_{31}$.

Figure 19:
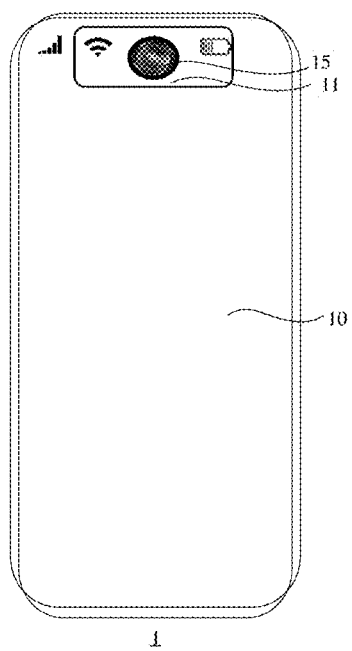
FIG. 19 is a schematic structural diagram of a display device according to an embodiment of the present disclosure.

An embodiment of the present disclosure further provides a display device. FIG. 19 is a schematic structural diagram of a display device according to an embodiment of the present disclosure. As shown in FIG. 19, the display device includes the display panel 10 described above and the camera module 15 disposed on the display panel 10. The structure of the display panel 10 has been described in detail in the above embodiments, and is not repeated herein. The display device shown in FIG. 19 is merely illustrative. The display device can be any electronic device having a display function, such as a mobile phone, a tablet computer, a notebook computer, an electronic paper book, or a television.

Since the display device provided by the embodiment of the present disclosure includes the above display panel, the display panel has the first display area, and the camera module is arranged in an area with a smaller pixel density in the first display area. By setting the area of the reflective metal layer of the anode to be smaller than the area of the transparent conductive layer the anode, the light transmittance of the anode is increased, so that the light transmittance of the first display area is improved, thereby allowing the camera module (which includes the optical imaging unit and the image processing unit) to receive more external light. In this way, the pixel units located in the first display area and the pixel units located in the second display area of the display panel have the same luminous intensity, thereby ensuring uniformity of the overall display of the display panel, and meanwhile the light transmittance of the first display area is increased. In this way, the camera module can be arranged in the display panel or arranged separately in add-on manner, so that the camera can be integrated in the display panel to achieve a true "full screen".

The above are merely exemplary embodiments of the present disclosure and are not intended to limit the present disclosure. Any modification, equivalent replacement, or improvement made within the principles of the present disclosure shall fall into the protection scope of the present disclosure.

What is claimed is:

1. A display panel, having a first display area and a second display area,
   wherein the display panel comprises:
      first pixel units arranged in the first display area; and
      second pixel units arranged in the second display area,
   wherein a density of the first pixel units in the first display area is smaller than a density of the second pixel units in the second display area,
   wherein each of the first pixel units comprises a first anode comprising a first reflective metal layer and a first transparent conductive layer, the first reflective metal layer and the first transparent conductive layer being stacked on each other, and an area of the first reflective metal layer being smaller than an area of the first transparent conductive layer,
   wherein the second display area surrounds the first display area, and the first display area comprises a transition area close to the second display area, and wherein a difference between the area of the first transparent conductive layer and the area of the first reflective metal layer gradually increases along a direction from the transition area to a central area of the first display area, or a difference between the area of the first transparent conductive layer and the area of the first reflective metal layers gradually decreases along the direction from the transition area to the central area of the first display area.

2. The display panel according to claim 1, further comprising constant potential signal lines configured to provide constant potential signals to the first pixel units,
wherein each of the constant potential signal lines is electrically connected to the first anode through a first via, and the area of the first reflective metal layer is larger than an area of the first via.

3. The display panel according to claim 1, wherein each of the second pixel units comprises a second anode, wherein the second anode comprises a second reflective metal layer and a second transparent conductive layer, the second reflective metal layer and the second transparent conductive layer being stacked on each other, an area of the second reflective metal layer being equal to an area of the second transparent conductive layer, and the area of the first reflective metal layer being smaller than or equal to the area of the second reflective metal layer.

4. The display panel according to claim 3, wherein the first reflective metal layer and the second reflective metal layer each comprise metal silver, and the first transparent conductive layer and the second transparent conductive layer each comprise indium tin oxide;
wherein the first transparent conductive layer comprises two first transparent conductive sub-layers, and the first anode has a sandwich structure comprising one of the two first transparent conductive sub-layers, the first reflective metal layer, and the other one of the two first transparent conductive sub-layers in sequence; and
wherein the second transparent conductive layer comprises two second transparent conductive sub-layers, and the second anode has a sandwich structure comprising one of the two second transparent conductive sub-layers, the second reflective metal layer, and the other one of the two second transparent conductive sub-layers in sequence.

5. The display panel according to claim 3, wherein the first reflective metal layer comprises a plurality of reflective metal sub-electrodes that are separated from each other or electrically connected to each other.

6. The display panel according to claim 5, wherein each of the plurality of reflective metal sub-electrodes has a stripe-like structure; or
each of the plurality of reflective metal sub-electrodes has a block-like structure and the plurality of reflective metal sub-electrodes are distributed as scattered spots.

7. The display panel according to claim 1, wherein the difference between the area of the first transparent conductive layer and the area of the first reflective metal layer gradually increases along the direction from the transition area to the central area of the first display area, areas of first transparent conductive layers of all first pixel units in the first display area are equal along the direction from the transition area to the central area of the first display area, and areas of first reflective metal layers of all first pixel units in the first display area gradually decrease along the direction from the transition area to the central area of the first display area.

8. The display panel according to claim 1, wherein the difference between the area of the first transparent conductive layer and the area of the first reflective metal layers gradually decreases along the direction from the transition area to the central area of the first display area, areas of first reflective metal layers of all first pixel units in the first display area are equal along the direction from the transition area to the central area of the first display area, and areas of first transparent conductive layers of all first pixel units in the first display area gradually decrease along the direction from the transition area to the central area of the first display area.

9. The display panel according to claim 8, wherein the area of the first transparent conductive layer in the central area is equal to the area of the second transparent conductive layer.

10. The display panel according to claim 1, wherein a light transmittance of the first display area is greater than a light transmittance of the second display area, and a light-emitting area of each of the first pixel units is greater than or equal to a light-emitting area of each of the second pixel units.

11. The display panel according to claim 1, wherein a first current density flowing through each of the first pixel units is equal to a second current density flowing through each of the second pixel units.

12. The display panel according to claim 1, further comprising:
an optical imaging unit; and
an image processing unit,
wherein the optical imaging unit is configured to receive external light passing through the first display area, to convert a light signal into a current signal, and to transmit the current signal to the image processing unit.

13. A display panel, having a first display area and a second display area,
wherein the display panel comprises:
first pixel units arranged in the first display area; and
second pixel units arranged in the second display area,
wherein a density of the first pixel units in the first display area is smaller than a density of the second pixel units in the second display area,
wherein each of the first pixel units comprises a first anode comprising a first reflective metal layer and a first transparent conductive layer, the first reflective metal layer and the first transparent conductive layer being stacked on each other, and an area of the first reflective metal layer being smaller than an area of the first transparent conductive layer,
wherein the first pixel units in the first display area comprise a first red pixel unit, a first green pixel unit, and a first blue pixel unit,
wherein a difference between an area of the first reflective metal layer of the first red pixel unit and an area of the first transparent metal layer of the first red pixel unit is $\Delta S_{31}$;
a difference between an area of the green first reflective metal layer of the first green pixel unit and an area of the first transparent metal layer of the first green pixel unit is $\Delta S_{41}$; and
a difference between an area of the first reflective metal layer of the first blue pixel unit and an area of the first transparent metal layer of the first blue pixel unit is $\Delta S_{51}$,
wherein $\Delta S_{41}$ is greater than at least one of $\Delta S_{31}$ or $\Delta S_{51}$.

14. The display panel according to claim 13, wherein $\Delta S_{41}$ is greater than both $\Delta S_{31}$ and $\Delta S_{51}$.

15. The display panel according to claim 13, wherein $\Delta S_{31}$ is greater than or equal to $\Delta S_{51}$, and $\Delta S_{41}$ is greater than $\Delta S_{31}$.

16. A display device, comprising a display panel having a first display area and a second display area, wherein the display panel comprises:
- first pixel units arranged in the first display area; and
- second pixel units arranged in the second display area,
- wherein a pixel density of the first pixel units in the first display area is smaller than a density of the second pixel units in the second display area,
- wherein each of the first pixel units comprises a first anode comprising a first reflective metal layer and a first transparent conductive layer, the first reflective metal layer and the first transparent conductive layer being stacked on each other, and an area of the first reflective metal layer being smaller than an area of the first transparent conductive layer,
- wherein the second display area surrounds the first display area, and the first display area comprises a transition area close to the second display area, and
- wherein a difference between the area of the first transparent conductive layer and the area of the first reflective metal layer gradually increases along a direction from the transition area to a central area of the first display area, or a difference between the area of the first transparent conductive layer and the area of the first reflective metal layers gradually decreases along the direction from the transition area to the central area of the first display area.

* * * * *